United States Patent
Fujita et al.

[11] Patent Number: 6,145,112
[45] Date of Patent: Nov. 7, 2000

[54] ERROR CORRECTING METHOD AND APPARATUS

[75] Inventors: Hachiro Fujita; Hideo Yoshida, both of Tokyo, Japan

[73] Assignee: Mitsubishi Denki Kabushiki Kaisha, Tokyo, Japan

[21] Appl. No.: 09/005,603

[22] Filed: Jan. 12, 1998

[30] Foreign Application Priority Data

| May 1, 1997 | [JP] | Japan | ................................. | 9-114082 |
| Oct. 31, 1997 | [JP] | Japan | ................................. | 9-301314 |

[51] Int. Cl.⁷ ................................. H03M 13/15
[52] U.S. Cl. ................................. 714/784
[58] Field of Search ................................. 714/784

[56] References Cited

U.S. PATENT DOCUMENTS

| 4,099,160 | 7/1978 | Flagg | ............................. | 340/146.1 AL |
| 4,142,174 | 2/1979 | Chen et al. | ..................... | 340/146.1 AL |
| 4,162,480 | 7/1979 | Berlekamp | ..................... | 340/146.1 AL |
| 4,608,692 | 8/1986 | Nagumo et al. | ......................... | 371/37 |
| 4,644,544 | 2/1987 | Furuya et al. | ............................. | 371/37 |
| 4,646,303 | 2/1987 | Nurusawa et al. | ....................... | 371/38 |
| 4,683,572 | 7/1987 | Baggen et al. | ............................. | 371/37 |
| 4,742,517 | 5/1988 | Takagi et al. | ................................ | 371/2 |
| 5,068,856 | 11/1991 | Nagasawa et al. | ..................... | 371/37.5 |
| 5,155,734 | 10/1992 | Kashida et al. | ......................... | 371/37.1 |
| 5,627,843 | 5/1997 | Deng et al. | ............................. | 371/37.1 |
| 5,664,030 | 9/1997 | Iikuza | ..................................... | 382/321 |

FOREIGN PATENT DOCUMENTS

| 62128623 | 6/1987 | Japan . |
| 62186620 | 8/1987 | Japan . |
| 63193722 | 8/1988 | Japan . |
| 1260930 | 10/1989 | Japan . |
| 4-007848 | 2/1992 | Japan . |
| 81111647 | 4/1996 | Japan . |

OTHER PUBLICATIONS

Fenn et al., "Decoding Double–Error–Correcting Reed–Solomon Codes", IEE Proc. –Commun., vol. 142, No. 6, Dec. 1995, pp. 345–348.

Lee et al., "An–On–The–Fly Decoding Technique for Reed Solomon Codes", IEEE Transactions on Magnetics, vol. 32, No. 5, Sep. 1996, pp. 3962–3964.

*Primary Examiner*—Stephen M. Baker

[57] ABSTRACT

An error correcting method decides the impossibility of error correction on the basis of only syndrome values and estimates a double error from only an operation expression B and, in a particular case where the impossibility of error correction cannot be decided based only on the syndrome values, decides the impossibility of error correction from the values of operation expressions, too.

5 Claims, 7 Drawing Sheets

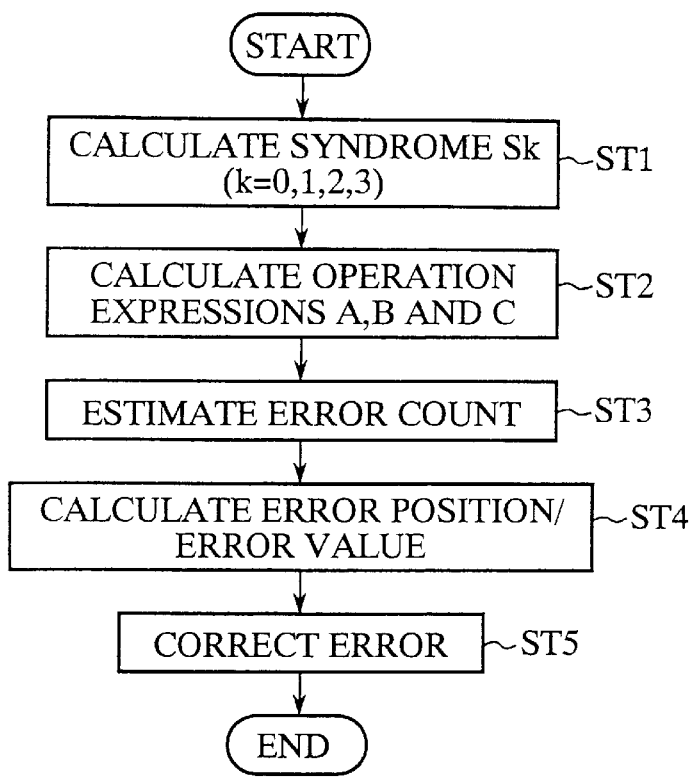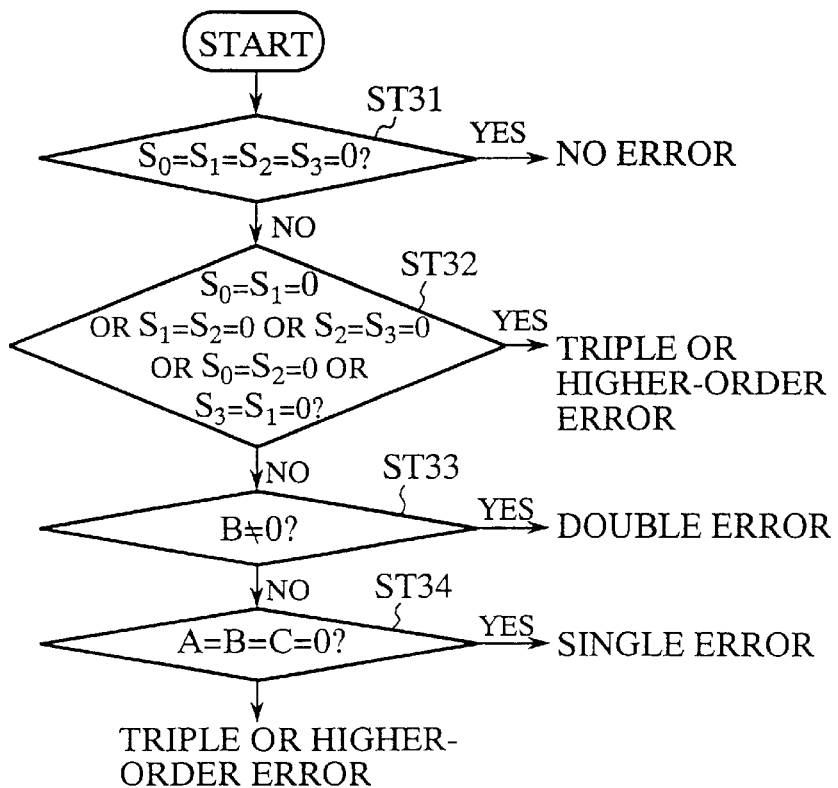

FIG.5

| $\alpha^k$ | $a_{k,3}$ | $a_{k,2}$ | $a_{k,1}$ | $a_{k,0}$ |
|---|---|---|---|---|
| 1 | 0 | 0 | 0 | 1 |
| $\alpha$ | 0 | 0 | 1 | 0 |
| $\alpha^2$ | 0 | 1 | 0 | 0 |
| $\alpha^3$ | 1 | 0 | 0 | 0 |
| $\alpha^4$ | 0 | 0 | 1 | 1 |
| $\alpha^5$ | 0 | 1 | 1 | 0 |
| $\alpha^6$ | 1 | 1 | 0 | 0 |
| $\alpha^7$ | 1 | 0 | 1 | 1 |
| $\alpha^8$ | 0 | 1 | 0 | 1 |
| $\alpha^9$ | 1 | 0 | 1 | 0 |
| $\alpha^{10}$ | 0 | 1 | 1 | 1 |
| $\alpha^{11}$ | 1 | 1 | 1 | 0 |
| $\alpha^{12}$ | 1 | 1 | 1 | 1 |
| $\alpha^{13}$ | 1 | 1 | 0 | 1 |
| $\alpha^{14}$ | 1 | 0 | 0 | 1 |

FIG.6

| ADDRESS | DATA |
|---------|------|
| 0001 | $r_0$ |
| 0010 | $r_1$ |
| 0011 | $r_4$ |
| 0100 | $r_2$ |
| 0101 | $r_8$ |
| 0110 | $r_5$ |
| 0111 | $r_{10}$ |
| 1000 | $r_3$ |
| 1001 | $r_{14}$ |
| 1010 | $r_9$ |
| 1011 | $r_7$ |
| 1100 | $r_6$ |
| 1101 | $r_{13}$ |
| 1110 | $r_{11}$ |
| 1111 | $r_{12}$ |

ERROR CORRECTING METHOD AND APPARATUS

BACKGROUND OF THE INVENTION

1. Field of the Invention

The present invention relates to an error correcting method and apparatus for correcting errors that arise in digital equipment or digital communications.

2. Description of the Prior Art

To correct errors that occur in digital equipment using a compact disk (CD), a digital audio tape (DAT), or the like or in digital communications, error correcting methods are selectively used according to the number of errors in the signal to be decoded. In such error correcting methods a Reed-Solomon code (hereinafter referred to as an "RS code") has been in wide use as an error correcting code for correcting errors in one signal on a byte-by-byte basis.

As decoding methods for the RS code, there are known a Peterson's algorithm, a Berlekamp's algorithm, a Euclid's algorithm and so forth, but when the error correcting power is small (single or double), the Peterson's algorithm is usually employed because of ease in calculation.

Roughly speaking, the decoding process by the Peterson's algorithm comprises the four steps mentioned below.

1. To calculate syndromes from the received word;
2. To estimate the number of errors and formulate an error position equation;
3. To find out the root of the error position equation; and
4. Calculate the value of error at each position corresponding to the root.

Of the above four steps, step 3 is usually performed using a Chien Search method that successively searches for the root while substituting elements of the Galois field into the error position equation.

As an example of such a Peterson's algorithm, there is disclosed, for example, in Japanese Pat. Pub. Gazette No. 7848/92, the following algorithm that follows the above procedure.

In the first place, syndromes S0, S1, S2 and S3 are calculated from the received word and operation expressions A, B and C are solved as follows:

$$A = S0\,S2 + S1^2$$

$$B = S1\,S2 + S0\,S3$$

$$C = S1\,S3 + S2^2$$

The number of errors (the error count) is estimated from the above and the necessary correction is made as follows;

(1) When $A=B=C=0$ and $S0=S3=0$, it is estimated that there is no error.

(2) When $A=B=C=0$ and $S0 \neq 0$ and $S3 \neq 0$, it is estimated that a single error has arisen. At this time, an error position i and an error value e bear the following relationship:

$$\alpha^i = S1/S0 \quad e = S0$$

where $\alpha$ is a root of an irreducible polynomial $F(x)$. The error position can be determined by prestoring a table of correspondence between the error position i and the root $\alpha^i$ in a ROM and retrieving it with the value $S1/S0$. The error value is $S0$.

(3) When $A \neq 0$ and $B \neq 0$ and $C \neq 0$, it is estimated that a double error has occurred. At this time, the error equation is such as follows:

$$Ax^2 + Bx + C = 0$$

Letting the two roots be represented by $\alpha^i$ and $\alpha^j$ (where $0 \leq i < j \leq n-1$), respectively, $$\alpha^i + \alpha^j = D$$

$$\alpha^i \alpha^j = E$$

where $D = B/A$ and $E = C/A$.

Letting the difference between the two error positions, that is, the difference between the two roots $\alpha^i$ and $\alpha^j$, be represented by t (where $t = j - i$), the following modifications can be made:

$$D = \alpha^i (1 + \alpha^t)$$

$$E = \alpha^{2i+t}$$

Therefore, $$D^2/E = \alpha^t + \alpha^{-t}$$

can be obtained. The difference t can be obtained by prestoring a table of values $\alpha^t + \alpha^{-t}$ corresponding to t(where $1 \leq t \leq n-1$) in the ROM and retrieving it with the value $D^2/E$.

By calculating $$X = 1 + \alpha^t$$

$$Y = 1 + \alpha^{-t} = D^2/E + X$$

from the above, the two roots can be obtained as follows:

$$\alpha^i = D/X$$

$$\alpha^j = D/Y$$

Thus the error positions i and j can be obtained by retrieving the table in the ROM with the values $D/X$ and $D/Y$ as is the case with the single error. And error values $e_i$ and $e_j$ at the error positions i and j are calculated as follows:

$$e_i = (\alpha^j S0 + S1)/D$$

$$e_j = (\alpha^i S0 + S1)/D$$

Since the conventional error correcting method is such as described above, the calculation of the syndrome values from received words is immediately followed by the calculation of the operation expressions A, B and C. However, for some of the received words it is impossible to perform error correction and the calculation of the operation expressions A, B and C for such received word is entirely useless processing—this gives arise to a problem that much time may sometimes be consumed to decide that for the received words it is impossible to perform error correction.

Based on the values of the syndromes S0, S1, S2 and S3 and the operation expressions A, B and C, the decision is made as to whether to make the error correction and no error pattern impossible of error correction can be detected from the values of the syndromes S0, S1, S2 and S3 alone; hence, a complex operation is needed to decide whether or not the error correction is to be made.

Another problem is that the condition for detecting the double error is complex because it is detected based on the values of the three operation expressions A, B and C.

Furthermore, the error correction begins with calculating the element $\alpha^i$ of the Galois field corresponding to the error position, followed by determination of the error position i by retrieving the table stored in the ROM. Accordingly, the decoding delay increases and the circuit scale is also large because of the use of the ROM.

Additionally, according to the conventional error correcting method, division needs to be done seven times for making a double error correction, but the computational load of division is so large that the decoding delay is significantly affected.

SUMMARY OF THE INVENTION

It is therefore an object of the present invention to provide an error correcting method and apparatus that permit decision of the impossibility of error correction from only syndromes.

Another object of the present invention is to provide an error correcting method and apparatus that facilitate detection of a double error.

Another object of the present invention is to provide an error correcting method and apparatus which permit fast computation of the error position from elements of the Galois field without retrieving a ROM table and hence dispense with it.

Still another object of the present invention is to provide an error correcting method and apparatus that permit fast correction of a double error with a single division.

To attain the above objectives, according to a first aspect of the present invention, there is provided an error correcting method which includes a first correction impossibility decision step of deciding that a triple or higher-order error is impossible to correct, based on syndromes generated in a syndrome generating step. With this method, it is possible to decide the impossibility of error correction from only syndromes and dispense with for the subsequent error correction procedure. This avoids useless computational processing when the error correction is impossible, thus permitting fast switching to the processing of the next received word.

According to a second aspect of the present invention, there is provided an error correcting method in which when adjacent or alternate ones of syndromes aligned in one direction are both zero, it is decided in the first correction impossibility decision step that the error correction is impossible. This method also produces the same effects as those obtainable with the method according to the first aspect of the invention.

According to a third aspect of the present invention, there is provided an error correcting method in which when the solution of an operation expression is not zero which is composed of the product of second and third ones of syndromes aligned in one direction and the product of first and fourth syndromes, it is estimated in an error count estimate step that the received word contains a double error. This method permits fast detection of the double error.

According to a fourth aspect of the present invention, there is provided an error correcting method which further includes a second correction impossibility decision step of deciding the impossibility of error correction based on an operation expression. With this method, it is possible to make a decision about the impossibility of error correction when such a decision cannot be made only based on syndromes.

According to a fifth aspect of the present invention, there is provided an error correcting method which further includes a polynomial formulating step wherein when it is estimated in an error count estimate step that the received word contains a double error, a polynomial is formulated which is composed only of a value obtained by dividing the value of an operation expression in which the order of an error position equation is a coefficient of the largest variable by the value of an operation expression in which the order of the error position equation is a coefficient of the second largest variable, and respective syndromes, and which calculates the error value by substituting the root of the error position equation into the polynomial in an error position/value calculating step. With this method, it is possible to make the error correction by performing time-consuming division processing only once and hence reduce the error correcting time.

According to a sixth aspect of the present invention, there is provided an error correcting method which comprises: an address generation step of generating an address for each symbol of the received word from a primitive element of the Galois field; a storage step of storing each symbol in the address generated in the address generation step; and an error correcting step of reading out each symbol stored in the storage step, on the basis of the error position and value calculated in an error position/value calculating step, and correcting an error of the received word accordingly. With this method, it is possible to quickly compute the error position from elements of the Galois field without retrieving a ROM table as required in the prior art and hence dispense with it.

According to a seventh aspect of the present invention, there is provided an error correcting apparatus which has error correction impossibility decision means for deciding the impossibility of correction of a triple or higher-order error on the basis of syndromes generated by syndrome generating means. This apparatus also produces the same effects as those mentioned above with respect to the first aspect of the invention.

According to an eighth aspect of the present invention, there is provided an error correcting apparatus which has: address generating means for generating the address of each symbol of a received word on the basis of a primitive element of the Galois field; a memory for storing the above-mentioned each symbol in the address generated by the address generating means; and error correcting means for reading out the said each symbol from the memory at the address corresponding to the position of an error of the received word on the basis of the position and value of the error calculated by error position/value calculating means and for correcting the error of the received word accordingly. With such an arrangement, it is possible to quickly calculate the position of an error from the element of the Galois field without retrieving the ROM table as required in the prior art and correct the error—this permits fast computation of the error position and eliminates the need for the use of the ROM table.

BRIEF DESCRIPTION OF THE DRAWINGS

Other object, features and advantages of the present invention will become more apparent from the following description taken in conjunction with the accompanying drawings, in which:

FIG. 1 is a flowchart of an error correcting method according to Embodiment 1 of the present invention;

FIG. 2 is a flowchart showing a detailed procedure of an error count estimate step ST3 in FIG. 1;

FIG. 5 is a table showing elements of the Galois field and the polynomial base in Embodiment 3;

FIG. 6 is a table showing addresses where to store respective symbols in Embodiment 3;

DETAILED DESCRIPTION OF THE PREFERRED EMBODIMENTS

Figure 3:
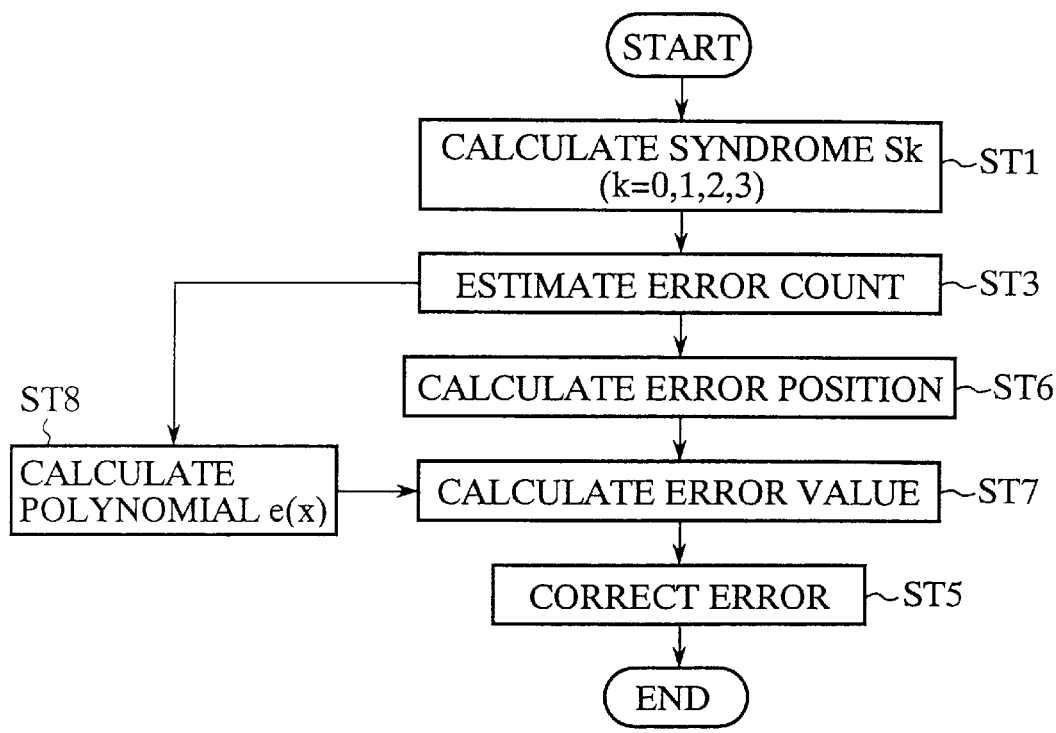
FIG. 3 is a flowchart of an error correcting method according to Embodiment 2 of the present invention.

A detailed description will be given, with reference to the accompanying drawings, of the preferred embodiments of the present invention.

Embodiment 1

FIG. 1 is a flowchart showing the procedure of the error correcting method according to Embodiment 1 of the present invention. Embodiment 1 has for its object to correct an error in the received word in the process of decoding the RS code sent in coded form.

In FIG. 1, ST1 is a step of calculating syndromes S0, S1, S2 and S3 from the received word; ST2 is a step of calculating the following operation expressions:

$$A = S0S2 + S1^2$$

$$B = S1S2 + S0S3$$

$$C = S1S3 + S2^2$$

ST3 is a step of estimating the number of errors from the syndromes S0, S1, S2, S3 and the operation expressions A, B, C; ST4 is an error position/error value-calculating step; and ST5 is an error-correcting step.

Next, the operation of Embodiment 1 will be described.

Letting a received word R and a parity matrix H be represented by $$R = (r_{n-1}\ r_{n-2}\ \ldots\ r_1\ r_0)$$

$$H = \begin{pmatrix} \alpha^{j(n-1)} & \alpha^{j(n-2)} & \cdots & \alpha^j & 1 \\ \alpha^{(j+1)(n-1)} & \alpha^{(j+1)(n-2)} & \cdots & \alpha^{j+1} & 1 \\ \alpha^{(j+2)(n-1)} & \alpha^{(j+2)(n-2)} & \cdots & \alpha^{j+2} & 1 \\ \alpha^{(j+3)(n-1)} & \alpha^{(j+3)(n-2)} & \cdots & \alpha^{j+3} & 1 \end{pmatrix}$$

(where $\alpha$ is a primitive element of the Galois field, j is a given integer and r is the value of each symbol of the received signal), the syndromes S0, S1, S2 and S3 are calculated by conducting the following operation (step ST1):

$$H \cdot R^t = \begin{pmatrix} S0 \\ S1 \\ S2 \\ S3 \end{pmatrix}$$

and the thus calculated syndromes are used to calculate the operation expressions A, B and C (step ST2).

Next, the number of errors is estimated from the syndromes S0, S1, S2, S3 and the operation expressions A, B, C (step ST3).

FIG. 2 shows in detail the procedure of the error count estimate step ST3. As shown in FIG. 2, the number of errors is estimated in step ST3 as described below.

In the first place, when S0=S1=S2=S3 (step ST31), it is estimated that there is no error.

This estimation is based on such grounds as mentioned below.

If the received word does not contain any error, the received word becomes an eigenvector of an eigenvalue 0 in the parity matrix H. Accordingly, the product of the parity matrix H and a transposed matrix of the received word R is zero and the syndromes S0, S1, S2 and S3 are all zeroes. Therefore, although all the syndromes are zeroes if no error is present, it is the condition for decision "no error" that all the syndromes are zeroes.

Next, when S0=S1=0, S1=S2=0, S2=S3=0, S3=S1=0, or (step ST32), it is estimated that a triple or higher-order error arises and cannot be corrected.

The reason for which such an estimation can be made will be described using "reductive absurdity" in connection with the case of S0=S1=0. For convenience, we assume that j in the parity matrix H is zero.

At this time, since S0=S1=0, not S0=S1=S2=S3=0, it is a matter of course that S2≠0 or S3≠0 holds true.

Now, assume that a single error has arisen. Letting the position and value of the error be represented by i and $e_i$, respectively, S0=$e_i$, but since S0=0, $e_i$=0.

Thus $$S2 = e_i \alpha^{2i} = 0\quad S3 = e_i \alpha^{3i} = 0$$

This is contrary to the condition S2≠0 or S3≠0.

Next, assume that a double error (two errors) has occurred. Letting the position and value of the errors be represented by i, j and $e_i$, $e_j$, respectively, $$S0 = e_i + e_j\quad S1 = e_i \alpha^i + e_j \alpha^j$$

but since S0=S1=0, $$e_i + e_j = 0\quad e_i \alpha^i + e_j \alpha^j = 0$$

Solving the both equations for $e_i$ and $e_j$, $e_i$=$e_j$=0 is obtained.

On the other hand, since $$S2 = e_i \alpha^{2i} + e_j \alpha^{2j}\quad S3 = e_i \alpha^{3i} + e_j \alpha^{3j}$$

S0=S3=0; this is contrary to the condition S2≠0 or S3≠0.

For the reasons given above, when S0=S1=0, not S0=S1=S2=S3=0, if an assumption that a double or lower-order error has occurred, a contradiction arises; hence, it can be estimated that a triple or higher-order error has occurred. Similarly, also in the case where not S0=S1=S2=S3=0 but S1=S2=0, S2=S3=0, S3=S1=0, or S0=S2=0, it can be triple or higher-order error has arisen.

Incidentally, the triple or higher-order error has not always arisen when S0=S3=0. This will be described below using a double correction RS code having a code length 15 and 11 information symbols of the Galois field $GF(2^4)$.

Consider that errors $e_5=e_{10}=e(\neq 0)$ of the same size have arisen at positions 5 and 10 in the received word $R=(r_{14}, r_{13}, \ldots r_1, r_0)$. Letting $\alpha$ represent a primitive element of the Galois field, the syndromes S0 and S3 are given as follows:

$$S0 = e_5 + e_{10} = e + e = 0$$

$$S3 = e_5\alpha^{3\cdot 5} + e_{10}\alpha^{3\cdot 10} = e\alpha^{15} + e\alpha^{30} e + e = 0$$

and S0=S3=0 is obtained. In the above, the property $\alpha^{15} = \alpha^{30} = 1$ of the primitive element $\alpha$ is used.

The syndromes S1 and S2 are given as follows:

$$S1 = e_5\alpha^5 + e_{10}\alpha^{10} = e(\alpha^5 + \alpha^{10}) = e$$

$$S2 = e_5\alpha^{2\cdot 5} + e_{10}\alpha^{2\cdot 10} = e\alpha^{10} + e\alpha^{20} = e$$

These syndromes are not zeroes. In the above, the property $\alpha^5 + \alpha^{10} = 1$ of the primitive element $\alpha$ is used.

Evidence has been given above that an error pattern of the double error which satisfies the condition S0=S3=0. In this instance, the operation expressions A, B and C are $$A = S0 S2 + S1^2 = e^2$$

$$B + S1 S2 + S0 S3 = e^2$$

$$C = S1 S3 + S2^2 = e^2$$

and since the condition $B \neq 0$ holds, it is possible to detect that the double error has arisen.

The following arguments can be made about the double correction RS code on the general Galois field $GF(2^m)$ (where m is a natural number).

Assume that a double or lower-order error has arisen and satisfies the condition S0=S3=0. Let the positions and magnitudes of the double error be represented by i, j and $e_i, e_j$, respectively.

At this time, the following matricial relationship is obtained from S0=S3=0.

$$\begin{pmatrix} 1 & 1 \\ \alpha^{3i} & \alpha^{3j} \end{pmatrix} \begin{pmatrix} e_i \\ e_j \end{pmatrix} = \begin{pmatrix} 0 \\ 0 \end{pmatrix}$$

where $\alpha$ is the primitive element of the Galois $GF(2^m)$.

The condition for the presence of a nontrivial value $(e_i, e_j)$ that satisfies the above relationship is that the following determinant $\Delta$ becomes zero.

$$\Delta = \begin{vmatrix} 1 & 1 \\ \alpha^{3i} & \alpha^{3j} \end{vmatrix}$$

Taking into account that $\alpha^i \neq \alpha^j$, the condition for which $\Delta = 0$ is obtained from $\Delta = \alpha^{3i} + \alpha^{3j} = (\alpha^i + \alpha^j)(\alpha^{2i} + \alpha^i\alpha^j + \alpha^{2j})$ is $\alpha^{2i} + \alpha^i\alpha^j + \alpha^{2j} = 0$. This condition is equivalent to that the equation $x^2 + x + 1 = 0$ has a root on the Galois field $GF(2^m)$. It is well known in the art that the condition for this equation to have the root is that m be an even number. Accordingly, it will be seen that when m is an even number, a double error is present which satisfies the condition S0=S3=0. In the above example, m=4. On the other hand, it will be seen that when m is an odd number, there is not present a double or lower-order error that satisfies the condition S0=S3=0.

In summary, the double error correction RS code on the Galois field $GF(2^m)$ falls into the following categories, depending on whether m is even or odd.

When m is even:
If the two syndromes are zeroes except S0=S3=0, it can be estimated that a triple or higher-order error has occurred.

When m is odd:
If two syndromes are zeroes, it can be estimated that a triple or high-order error has occurred.

Hence, when m is even and S0=S3=0 holds, it cannot always be said that the triple or higher-order error has arisen.

When the syndromes S0, S1, S2 and S3 do not satisfy any relationships in step ST2 in FIG. 2, it is decided whether the operation expression B is $B \neq 0$ (step ST33), and if so, it is estimated that a double error has arisen.

The reason for this estimation will be described below using the reductive absurdity.

In the first place, the above-mentioned operation expressions A, B and C are used to obtain the following error position equation:

$$Ax^2 + Bx + C = 0$$

Assuming that the operation expression B=0, the error position equation becomes $$Ax^2 + C = 0$$

This equation has only one root at most. This indicates that a double error occurs when $B \neq 0$.

When B is zero, a decision is made as to whether or not the operation expressions A, B and C bear the relationship A=B=C=0 (step ST34), and if so, it is estimated that a single error has occurred.

This will be described below.

When a single error has arisen, letting its position and value be represented by i and $e_i$, respectively, $S0 = e_i$, $S1 = e_i\alpha^i$, $S2 = e_i\alpha^{2i}$ and $S3 = e_i\alpha^{3i}$.

From this, $$A = S0 S2 + S1^2 = e_i(e_i\alpha^{2i}) + (e_i\alpha^i)^2 = 0$$

Thus A=0 is obtained. B=C=0 is also similarly obtained.

Based on the above, it is estimated that the single error has occurred when A=B=C=0.

When the syndromes S0, S1, S2, S3 and the operation expressions A, B, C do not satisfies any of the above relations, it is estimated that a triple or higher-order error has occurred.

When estimated to be error-free, the received word is output intact. When it is estimated that a single or double error has occurred, the position and value of the error are calculated (step ST4), then the error is corrected (step ST5), and the corrected result is output. When it is estimated that a triple or higher-order error has arisen, an estimation result to the effect that the error correction is impossible is output together with an error detection flag and the subsequent correcting operation is discontinued.

That is, in Embodiment 1 it is decided first in the error count estimate step ST3, based on only the values of the syndromes S0 through S3, as to whether or not the error correction is impossible, and if impossible, the subsequent calculations of the operation expressions A to C are abandoned. If the error correction is possible, the operation expressions A to C are calculated, and if B is not zero, it is decided that a double error is present; if A, B and C are zeroes, it is decided that a single error is present.

As described above, according to Embodiment 1, it is possible to decide the impossibility of error correction by the use of only the syndromes and dispense with the subsequent error correcting procedure. Hence, when the error correction is impossible, processing of the next received word can be started in a short time without involving useless computation processing.

Besides, the double error can be detected from only the operation expression B. This permits fast detection of the double error.

Embodiment 2

FIG. 3 is a flowchart showing the procedure of the error correcting method according to Embodiment 2 of the present invention. In FIG. 3, the steps similar to those in FIG. 1 are marked with the same step numbers as those in the latter.

In FIG. 3, ST6 is a step of calculating an error position, ST7 is a step of calculating an error value, and ST8 is a step of calculating the following polynomial $$e(x)=a/b(S0x+S1)+S0$$

Next, the operation of this embodiment will be described.

Letting a received word R and a parity matrix H be represented by $$R=(r_{n-1}\ r_{n-2}\ \ldots\ r_1\ r_0)$$

$$H = \begin{pmatrix} 1 & 1 & \cdots & 1 & 1 \\ \alpha^{n-1} & \alpha^{n-2} & \cdots & \alpha & 1 \\ \alpha^{2(n-1)} & \alpha^{2(n-2)} & \cdots & \alpha^2 & 1 \\ \alpha^{3(n-1)} & \alpha^{3(n-2)} & \cdots & \alpha^3 & 1 \end{pmatrix}$$

(where $\alpha$ is a primitive element of the Galois field), the syndromes S0, S1, S2 and S3 are calculated (step ST1) by $$H \cdot R^t = \begin{pmatrix} S0 \\ S1 \\ S2 \\ S3 \end{pmatrix}$$

then the number of errors is estimated from the thus calculated syndromes (step ST3), and the error position and error value are calculated (steps ST6, ST7), followed by an error correction (step ST5).

In the error count estimate step ST3, when a double error is estimated, the following error position equation is given $$ax^2+bx+c=0$$

Suppose that this equation has two different roots u and v which are not zeroes. (Otherwise the error is not a double error and no further processing is performed.) In the above, a, b and c are elements of the Galois field.

In this case, letting error values corresponding to the two roots u and v be represented by $e_u$ and $e_v$, respectively, the error values $e_u$ and $e_v$ satisfy the following equations:

$$S0=e_u+e_v \quad (1)$$

$$S1=e_u u+e_v v \quad (2)$$

By Eqs. (1) and (2) uS0+S1=$e_v$(u+v) is found, but by using u+v=b/a, $e_v$=a/b(uS0+S1)

Therefore, from Eq. (1)

$$e_u=a/b(uS0+S1)+S0$$

Likewise, $e_v$=a/b(vS0+S1)+S0

When it is estimated that a double error has arisen, the following polynomial is calculated (step ST8)

$$e(x)=a/b(s0x+S1)+S0$$

and by substituting u and v thereinto, the error values $e_u$ and $e_v$ are calculated (step ST7).

As described above, according to Embodiment 2, the error can be corrected by performing time-consuming division processing only once (a/b), and hence the error correcting time can be reduced.

Embodiment 3

Figure 4:
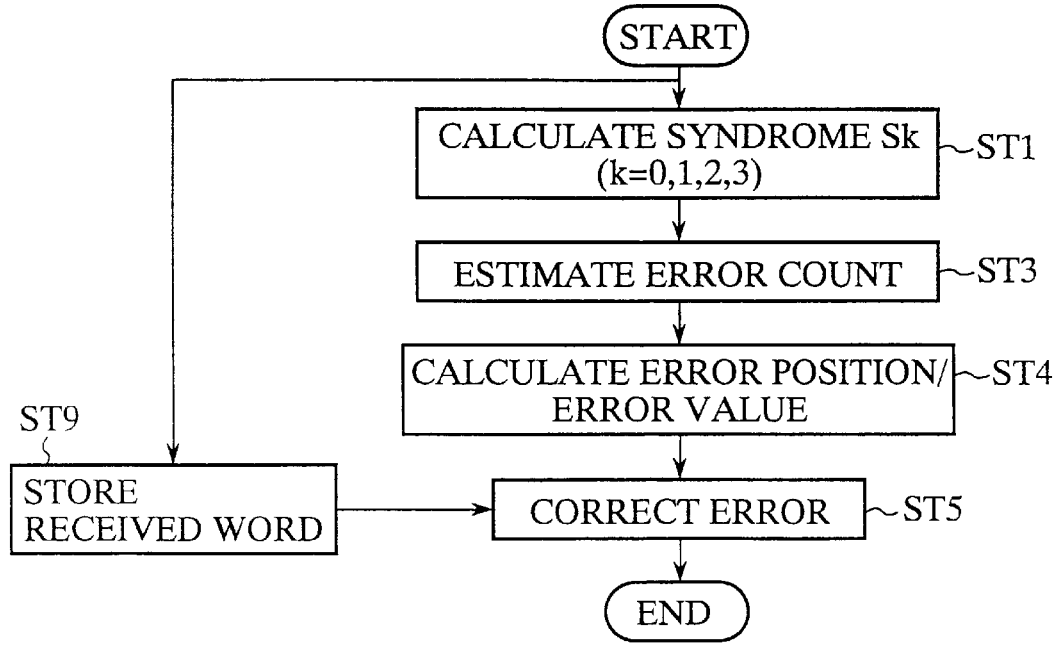
FIG. 4 is a flowchart of an error correcting method according to Embodiment 3 of the present invention.

FIG. 4 is a flowchart showing the procedure of the error correcting method according to Embodiment 3 of the present invention, in which the steps of the same operation as those in the flowchart of FIG. 1 are identified by the same step numbers as those in the latter. In FIG. 4, ST9 is a step of storing the received word in a memory.

The operation of this embodiment will be described.

Letting a received word R and a parity matrix H be represented by $$R=(r_{n-1}\ r_{n-2}\ \ldots\ r_1\ r_0)$$

$$H = \begin{pmatrix} \alpha^{j(n-1)} & \alpha^{j(n-2)} & \cdots & \alpha^j & 1 \\ \alpha^{(j+1)(n-1)} & \alpha^{(j+1)(n-2)} & \cdots & \alpha^{j+1} & 1 \\ \alpha^{(j+1)(n-1)} & \alpha^{(j+2)(n-2)} & \cdots & \alpha^{j+2} & 1 \\ \alpha^{(j+3)(n-1)} & \alpha^{(j+3)(n-2)} & \cdots & \alpha^{j+3} & 1 \end{pmatrix}$$

(where $\alpha$ is a primitive element of the Galois field and j is a given integer), the syndromes S0, S1, S2 and S3 are calculated by conducting the following operation (step ST1):

$$H \cdot R^t = \begin{pmatrix} S0 \\ S1 \\ S2 \\ S3 \end{pmatrix}$$

and the thus calculated syndromes are used to estimate the number of errors, i.e. the error count(step ST2). Based on this error count estimate, the error position/error value are calculated (step ST4) and the error is corrected (step ST5).

A method of memory allocation to the received word will be described in connection with the case of m=4 and n=15, where m is the number of bits forming each of the symbols $r_{n-1}, r_{n-2}, \ldots r_1, r_0$ of the received word R and n is the number of symbols forming the received word R. In this instance, the Galois field is GF (16) and its primitive 15th power root $\alpha$ is given by $x^4+x+1=0$.

$\alpha^k$ (where k=0,1,2, . . . ,14) is expressed in the following polynomial form, using a polynomial base:

$$\alpha^k=a_{k,3}\alpha^3+a_{k,2}\alpha^2+a_{k,1}\alpha+a_{k,0}$$

This is shown in FIG. 5. Letting the received word R be represented by $$R=(r_{14}\ r_{13}\ \ldots\ r_1\ r_0)$$

the respective symbols of the received word R are stored in the memory as depicted in FIG. 6 (step ST9).

The base used in the above is not limited specifically to the polynomial base and a normal base and any other bases can be used, but the operation of the Galois field must be conducted on the selected base.

When it is estimated in the error count estimate step ST3 that a single error has arisen, the error position i and the error value e bear the following relationships;

$$\alpha^i=S1/S0 \quad e=S0$$

In this instance, the error-bearing symbol is $r_i$, which is data stored in the memory at the address $\alpha^i$, i.e. S1/S0. By adding the syndrome S0 to this data, the error correction in step ST5 is made.

When it is estimated that a double error has occurred, the following error position equation is given $$ax^2+bx+c=0$$

Suppose that this equation has two different roots $u=\alpha^i$ and $v=\alpha^j$ which are not zeroes; otherwise, the error is not a double error and the processing is terminated with error detection. In this case, error-bearing symbols are $r_i$ and $r_j$, which are pieces of data stored in the memory at addresses $\alpha^i$ and $\alpha^j$, that is, two roots u and v. By adding error values $e_u$ and $e_v$ to the pieces of data, the errors are corrected.

As described above, according to Embodiment 3, the root of the error position equation is used as the address of the symbol of the received word, by which it is possible to quickly calculate the error position from the element of the Galois field without retrieving the ROM table as required in the prior art—this permits fast calculation of the error position and eliminates the need of the ROM table.

Embodiment 4

Embodiment 4 employs the error count estimate step (ST3) of Embodiment 1 in the procedure of the error correcting method of Embodiment 2 shown in FIG. 3; this embodiment is intended to enhance the error detection rate and improve the decoding delay.

The operation of this embodiment will be described below.

Letting a received word R and a parity matrix H be represented by $$R=(r_{n-1}\ r_{n-2}\ \ldots\ r_1,\ r_0)$$

$$H = \begin{pmatrix} 1 & 1 & \cdots & 1 & 1 \\ \alpha^{n-1} & \alpha^{n-2} & \cdots & \alpha & 1 \\ \alpha^{2(n-2)} & \alpha^{2(n-2)} & \cdots & \alpha^2 & 1 \\ \alpha^{3(n-1)} & \alpha^{3(n-2)} & \cdots & \alpha^3 & 1 \end{pmatrix}$$

(where $\alpha$ is a primitive element of the Galois field), the syndromes S0, S1, S2 and S3 are calculated (step ST1) by $$H \cdot R^t = \begin{pmatrix} S0 \\ S1 \\ S2 \\ S3 \end{pmatrix}$$

then the number of errors is estimated from the thus calculated syndromes S0, S1, S2 and S3 (step ST3), and the error position and error value are calculated (steps ST6, ST7), followed by an error correction (step ST5).

In the error count estimate step ST3, the following operation expressions are calculated:

$$A=S0S2+S1^2$$

$$B=S1S2+S0S3$$

$$C=S1S3+S2^2$$

and the error count is estimated using the method of Embodiment 1. If it is estimated that a double error has arisen, the following error position equation is given $$Ax^2+Bx+C=0$$

Assuming that this equation has two different roots u and v which are not zeroes, letting the corresponding error values be represented by $e_u$ and $e_v$, respectively, the following polynomial is calculated $$e(x)=A/B(S0x+S1)+S0$$

the error values $e_u$ and $e_v$ are calculated by substituting thereinto the two roots as in Embodiment 2.

As described above, according to Embodiment 4, it is possible to increase the error detection rate and improve the decoding delay.

Embodiment 5

Embodiment 5 employs the method of Embodiment 1 in the error count estimate step (step ST3) in the procedure of Embodiment 3 shown in FIG. 4 and the method of Embodiment 2 when it is estimated in the error position/error value calculating step (step ST4) that a double error has arisen; this embodiment is intended to raise the error detection rate, improve the decoding delay and reduce the circuit scale.

The operation of this embodiment will be described below.

Letting a received word R and a parity matrix H be represented by $$R=(r_{n-1}\ r_{n-2}\ \ldots\ r_1\ r_0)$$

$$H = \begin{pmatrix} 1 & 1 & \cdots & 1 & 1 \\ \alpha^{n-1} & \alpha^{n-2} & \cdots & \alpha & 1 \\ \alpha^{2(n-2)} & \alpha^{2(n-2)} & \cdots & \alpha^2 & 1 \\ \alpha^{3(n-1)} & \alpha^{3(n-2)} & \cdots & \alpha^3 & 1 \end{pmatrix}$$

(where $\alpha$ is a primitive element of the Galois field), the syndromes S0, S1, S2 and S3 are calculated (step ST1) by $$H \cdot R^t = \begin{pmatrix} S0 \\ S1 \\ S2 \\ S3 \end{pmatrix}$$

and, as in Embodiment 1, the number of errors is estimated from the thus calculated syndromes S0, S1, S2 and S3 (step ST3). When it is estimated that a double error has occurred, the same error estimate processing as in Embodiment 2 is carried out (steps ST3, ST8) and, based on the estimation, the error is corrected accordingly (step ST5).

As in the case of Embodiment 3, a description will be given of the memory allocation to the received word when m=4 and n=15. In this instance, the Galois field is GF (16) and its primitive 15th power root $\alpha$ is given as the root of $x^4+x+1=0$. $\alpha^k$ (where k=0,1,2, . . . ,14) is expressed in the following polynomial form, using a polynomial base:

$$\alpha^k=a_{k,3}\alpha^3+a_{k,2}\alpha^2+a_{k,1}\alpha+a_{k,0}$$

Letting the received word R be represented by $$R=(r_{14}\ r_{13}\ \ldots\ r_1\ r_0)$$

the respective symbols of the received word R are stored in the memory as depicted in FIG. 6 previously referred to in Embodiment 3.

The base used in the above is not limited specifically to the polynomial base and a normal base and any other bases can be used, but the operation of the Galois field must be conducted on the selected base.

When it is estimated that a single error has arisen, the error position i and the error value e bear the following relationships;

$\alpha^i = S1/S0 \ e = S0$

In this instance, the error-bearing symbol is $r_i$, which is data stored in the memory at the address $\alpha^i$, i.e. S1/S0. By adding the syndrome S0 to this data, the error correction is made.

When it is estimated that a double error has occurred, the following error position equation is given $$ax^2 + bx + c = 0$$

Suppose that this equation has two different roots $u = \alpha^i$ and $v = \alpha^j$ which are not zeroes; otherwise, the error is not a double error and the processing is terminated with error detection. In this case, error-bearing symbols are $r_i$ and $r_j$, which are pieces of data stored in the memory at addresses $\alpha^i$ and $\alpha^j$, that is, two roots u and v. By adding error values $e_u$ and $e_v$ to the pieces of data, the errors are corrected.

As described above, according to Embodiment 5, it is possible to produce the effects of raising the error detection rate, improving the decoding delay and simplifying the circuit scale.

Embodiment 6

Figure 7:
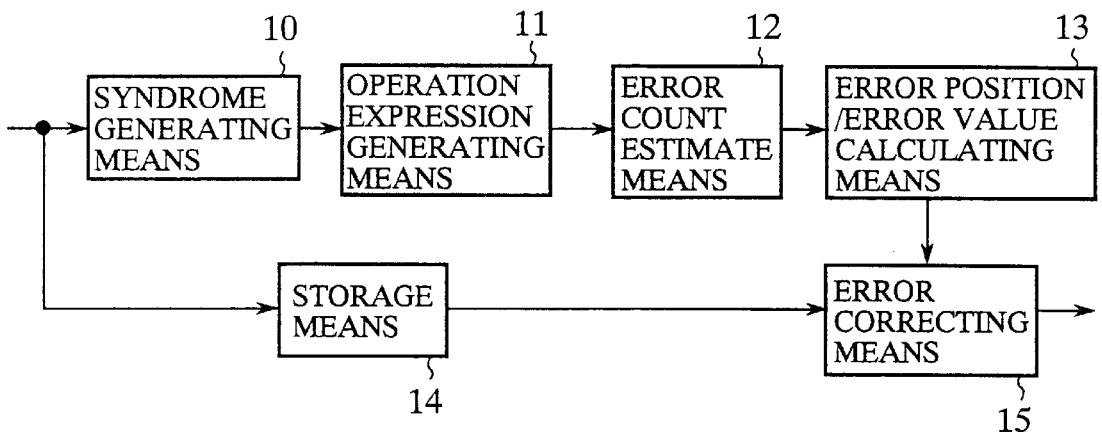
FIG. 7 is a block diagram illustrating an error correcting apparatus according to Embodiment 6 of the present invention.

FIG. 7 illustrates in block form an error correcting apparatus according to Embodiment 6 of the present invention. In FIG. 7, reference numeral 10 denotes a syndrome generating means (syndrome generating means, correction impossibility decision means) for generating syndromes S0, S1, S2 and S3 from the received word input thereinto; 11 denotes an operation expression generating means for generating the following operation expressions from the syndromes S0, S1, S2 and S3 calculated by the syndrome generating means 10

$$A = S0S2 + S1^2$$

$$B = S1S2 + S0S3$$

$$C = S1S3 + S2^2$$

12 denotes error count estimate means for estimating the number of errors in the received word from the syndromes and the operation expressions; 13 denotes error position/error value calculating means for calculating the error position and error value when it is estimated by the error count estimate means 12 that a single or double error has arisen; 14 denotes a storage means formed by a memory for storing the received word input thereinto; and 15 denotes error correcting means for correcting an error in the received word.

Figure 8:
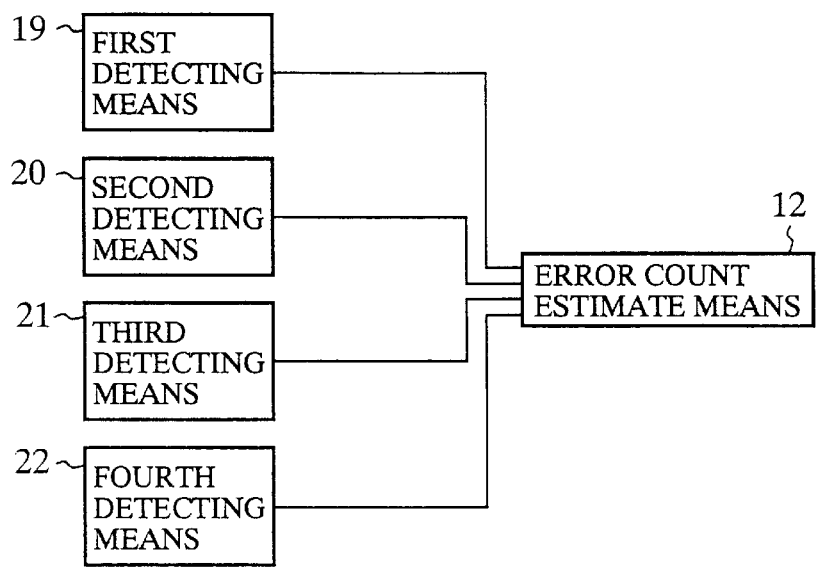
FIG. 8 is a block diagram showing in detail the configuration of error count estimate means in Embodiment 6.

FIG. 8 illustrates in detail in block form the configuration of the error count estimate means 12. In FIG. 8, reference numeral 19 denotes first detecting means for detecting whether the syndromes S0, S1, S2 and S3 are all zeroes or not (that is, whether S0=S1=S2=S3=0 or not); 20 denotes second detecting means for detecting whether the syndromes S0, S1, S2 and S3 are S0=S1=0, S1=S2=0, S2=S3=0, S3=S1=0; 21 denotes third detecting means for detecting whether the operation expression B is zero or not (that is, whether or not B≠0); and 22 denotes detecting means for detecting whether the operation expressions A, B and C are all zeroes or not (that is, whether or not A=B=C=0).

Next, the operation of this embodiment will be described.

In the first place, the received word is input into the syndrome generating means 10 and the storage means 14. In the syndrome generating means 10 syndromes of the received word are generated, and in the storage means 14 the received word is stored therein intact.

Next, in the operation expression generating means 11 operation expressions are generated from the syndromes generated by the syndrome generating means and are input into the error count estimate means 12. In the error count estimate means 12, the outputs from the first through fourth detecting means are detected, starting with the first detecting means. When the number of the detecting means is first, it is estimated that no error has arisen; when the number of the detecting means is second, it is estimated that a triple or higher-order error has arisen; when the number of the detecting means is third, it is estimated that a double error has arisen; when the number of the detecting means is fourth, it is estimated that a single error has arisen; and when the number is not any one of the first to fourth ones, it is estimated that a triple or higher-order error has arisen.

When it is estimated by the error count estimate means 12 that the received word is error-free, it is output intact. When it is estimated that the received word has a single or double error, the position and value of the error are calculated by the error position.error value calculating means 13, then the error is corrected by the error correcting means, and the received word is output. When it is estimated that the triple or higher-order error has occurred, the received word is output together with an error detection flag.

As described above, according to Embodiment 6, the impossibility of error correction can be decided using only syndromes and the double error can be estimated from only the operation expression B. Furthermore, also in a particular case where the impossibility of error correction cannot be decided using only the syndromes, it can be done using the operation expressions.

Embodiment 7

Figure 9:
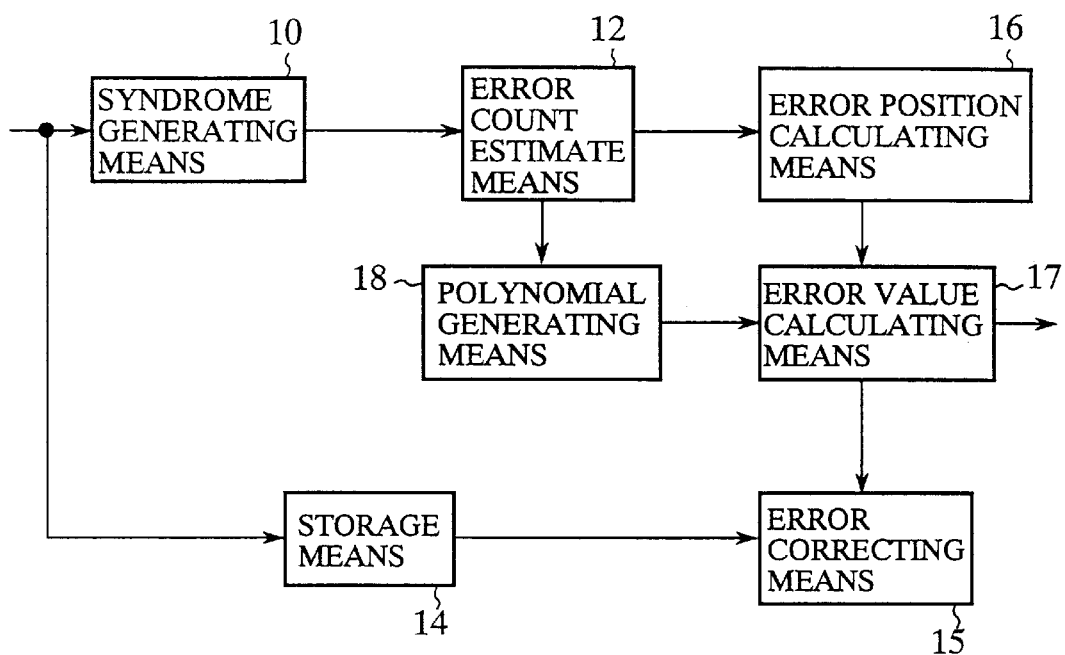
FIG. 9 is a block diagram illustrating an error correcting apparatus according to Embodiment 7 of the present invention.

FIG. 9 illustrates in block form an error correcting apparatus according to Embodiment 7 of the present invention, in which the same components as those in Embodiment 6 of FIG. 7 are identified by the same reference numeral and no description will be repeated.

In FIG. 9, reference numeral 16 denotes error position calculating means for calculating the error position when it is estimated that a single or double error has arisen; 17 denotes an error value calculating means for calculating the error value; and 18 denotes polynomial generating means for generating the following polynomial when it is estimated that the error is a double error.

$$e(x) = a/b(S0x + S1) + S0$$

Next, the operation of this embodiment will be described.

To begin with, the received word is input into the syndrome generating means 10 and the storage means 14. In the syndrome generating means 10 syndromes of the received word are generated and in the storage means 14 the received word is stored therein intact.

Next, when it is estimated by the error count estimate means 12 that a double error has arisen, the error position calculating means calculates two roots u and v from the following error position equation $$ax^2 + bx + c = 0$$

and, at the same time, the polynomial generating means 18 generates the following polynomial:

$$e(x) = a/b(S0x + S1) + S0$$

The error value calculating means 17 substitutes therein the two roots u and v, thereby calculating the error values $e_u$ and $e_v$.

As described above, according to Embodiment 7, it is possible to correct an error, doing the division (a/b) only once.

Embodiment 8

Figure 10:
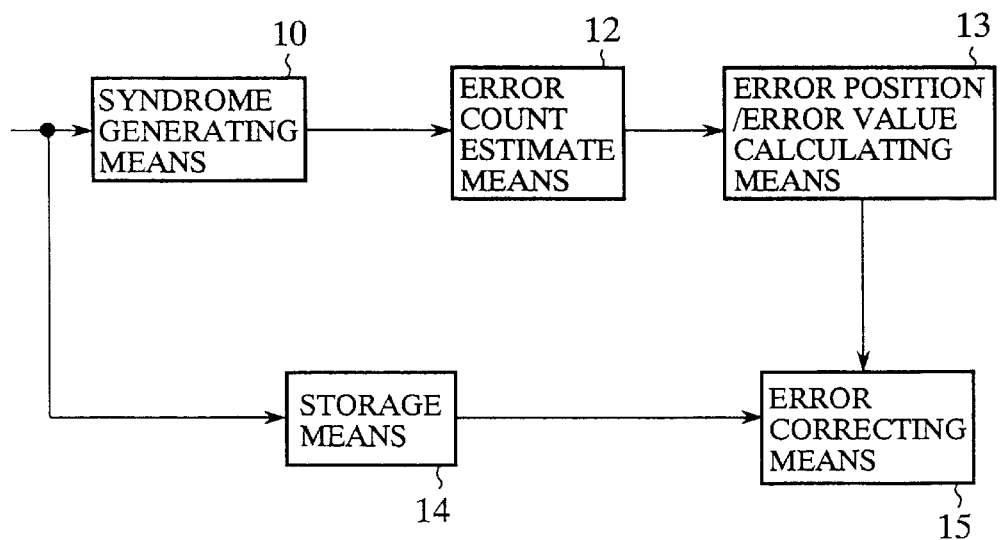
FIG. 10 a block diagram illustrating an error correcting apparatus according to Embodiment 8 of the present invention.
Figure 11:
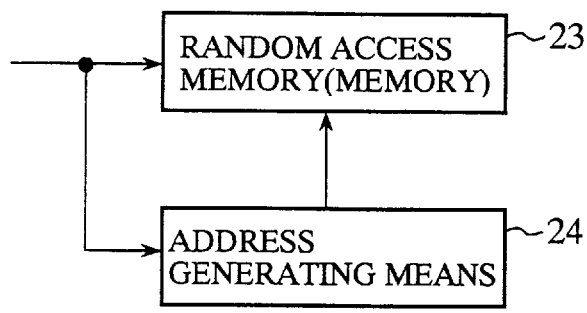
FIG. 11 is a block diagram showing in detail the configuration of storage means in Embodiment 8.

FIG. 10 illustrates in block form an error correcting apparatus according to Embodiment 8 of the present invention, in which the same components as those in Embodiment 6 of FIG. 7 are identified by the same reference numerals and no description will be repeated. FIG. 11 is a block diagram of the storage means 14 in FIG. 10.

In FIG. 11, reference numeral 23 denotes a random access memory (memory) and 24 denotes address-generating means for generating an address signal.

Next, the operation of this embodiment will be described.

In FIG. 10, the received word is input first into the syndrome generating means 10 and the storage means 14. In the syndrome generating means 10 syndromes of the received word are generated.

In the storage means 14, each symbol of the received word is input into the address generating means 24, wherein an address is generated, and the thus generated address is used to store each symbol in the random access memory 23.

A description will be given of the memory allocation to the received word in the case where m=4 and n=15. In this instance, the Galois field is GF (16) and its primitive 15th power root $\alpha$ is given as the root of $x^4+x+1=0$. $\alpha^k$ (where k=0,1,2, . . . ,14) is expressed in the following polynomial form, using a polynomial base:

$$\alpha^k = a_{k,3}\alpha^3 + a_{k,2}\alpha^2 + a_{k,1}\alpha + a_{k,0}$$

This is the same as shown in FIG. 5.

Let the received word R be represented by $$R=(r_{14}\ r_{13}\ \ldots\ r_1\ r_0)$$

Figure 12:
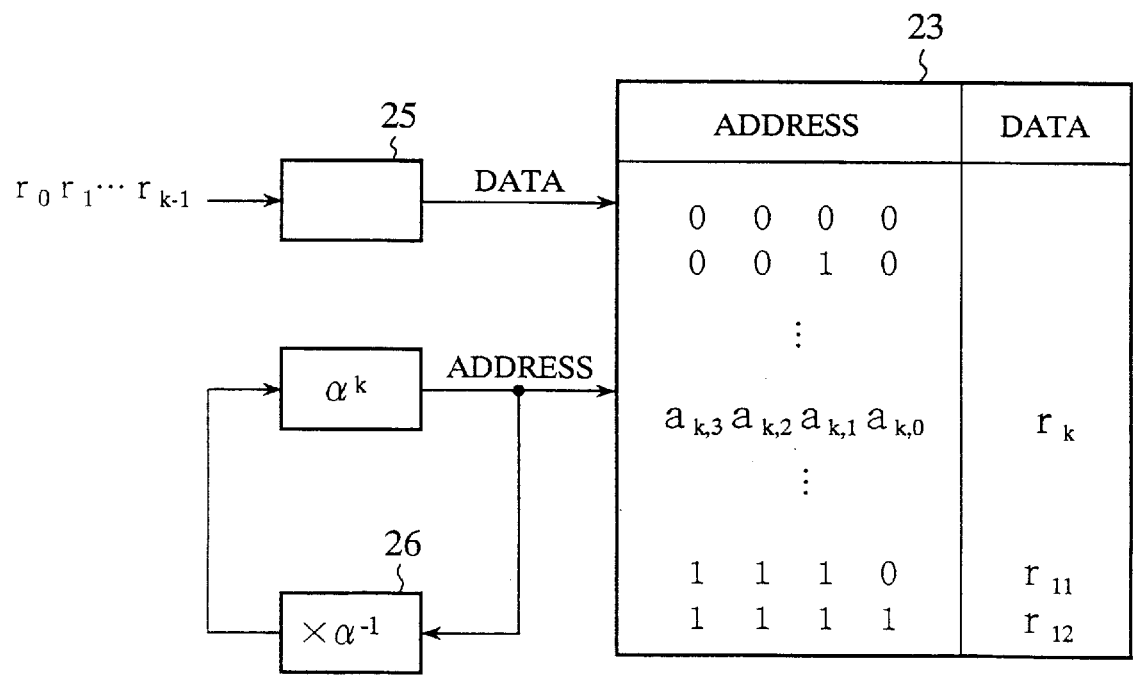
FIG. 12 is a block diagram showing the configuration of a received word input section in Embodiment 8.

FIG. 12 is a block diagram illustrating the configuration of the received word input part. In FIG. 12, reference numeral 25 denotes a buffer and 26 denotes an $\alpha^{-1}$ multiplier.

The symbols are stored in the memory, starting with the most significant symbol $r_{14}$. The symbols are each once stored in the buffer 25, thereafter being stored in the address specified by the $\alpha^{-1}$ multiplier 26.

When it is estimated by the error count estimate means 12 that a single error has arisen, the error correcting means 15 corrects the error by adding the syndrome S0 to the data stored in the memory at the address S1/S0.

When it is estimated by the error count estimate means 12 that a double error has occurred, the error position/error value calculating means 13 calculates two roots u and v of the following error position equation and the error values $e_u$ and $e_v$.

$$ax^2+bx+c=0$$

And the error correcting means 15 corrects the error by adding the error values $e_u$ and $e_v$ to the data stored in the memory addresses u and v.

As described above, according to Embodiment 8, the error position can immediately be calculated from the element of the Galois field without retrieving the ROM as in the prior art and the error can be corrected in a short time. That is, this embodiment permits fast calculation of the error position and eliminates the necessity of using the ROM table.

Embodiment 9

This embodiment is a modified form of the error correcting apparatus according to Embodiment 7 of FIG. 9, which applies the error correcting method of Embodiment 1 to the error count estimate means 12 so as to raise the error detection rate and improve the decoding delay.

The operation of this embodiment will be described.

In the first place, the received word is input into the syndrome generating means 10 and the storage means 14. In the syndrome generating means 10 syndromes of the received word are generated. In the storage means 14 the received word is stored therein intact.

Next, as is the case with Embodiment 1, the error count estimate means 12 generates the following operation expressions:

$$A=S0S2+S1^2$$

$$B=S1S2+S0S3$$

$$C=S1S3+S2^2$$

Then, the states of the syndromes S0, S1, S2, S3 or the operation expressions A, B, C are detected from the first detecting means for detecting (S0=S1=S2=S3=0), the second detecting means for detecting (S0=S1=0, S1=S2=0, S2=S3=0, S3=S1=0 or S0=S2=0), the third detecting means for detecting (B≠0) and the fourth detecting means for detecting (A=B=C=0) are detected, starting with the first detecting means. When the number of the detecting means having detected the above-mentioned state is the first, it is estimated that no error is present; when the number of the detecting means is the second, it is estimated that a triple or higher-order error has arisen; when the number of the detecting means is the third, it is estimated that a double error has arisen; when the number of the detecting means is the fourth, it is estimated that a single error has arisen; and when none of the first to fourth detecting means detect the above-mentioned states, it is estimated that a triple or higher-order error has arisen.

When it is estimated by the error count estimate means 12 that a double error has occurred, the error position calculating means 16 calculates the two roots u and v from the following error position equation:

$$Ax^2+Bx+C=0$$

At the same time, the polynomial generating means 18 generates the following polynomial:

$$e(x)=A/B(S0x+S1)+S0$$

The error value calculating means 17 substitutes the roots u and v into the polynomial, thereby calculating the error values $e_u$ and $e_v$.

As described above, according to Embodiment 9, it is possible to accurately estimate the error count from the syndromes and the operation expressions and correct the error, doing the division (A/B) only once.

Embodiment 10

This embodiment is a modified form of the error correcting apparatus of Embodiment 8, which employs the error count estimate means 12 and the error position/error value calculating means 13 of the same configurations as in Embodiment 9 so as to raise the error detection rate, improve the decoding delay and simplify the circuit scale.

That is, the operation expressions A, B and C are generated, then the error count is estimated by the first through fourth detecting means, and two roots of the error position equation are substituted into the polynomial to obtain the corresponding error values.

Thus, Embodiment 10 permits enhancement of the error detection rate, improvement of the decoding delay and simplification of the circuit scale.

The preferred embodiments of the present invention described above should be construed as being merely illustrative of the invention, and it is to be understood that many modifications and variations may be effected without departing from the scope of the novel concepts of the present invention.

What is claimed is:

1. An error correcting method comprising:

a syndrome generating step for generating four syndromes S0, S1, S2 and S3 from a received word;

an equation generating step for generating three equations A, B and C based on the syndromes, $$A = S0S2 + S1^2$$
$$B = S1S2 + S0S3$$
$$C = S1S3 + S2^2;$$

an estimating step for estimating a number of errors in the received word, based on the syndromes and the equations such that it is estimated that no error has occurred in the received word when all of the syndromes are zero, that a single error has occurred in the received word when all of the equations are zero, and that a double error has occurred in the received word when B is not zero;

a calculating step for calculating an error position and an error value when the single error or the double error has occurred; and a correcting step for correcting the error based on the position and value calculated in said calculating step.

2. An error correcting method according to claim 1, further comprising:

a polynomial generating step for generating, when it is estimated that the double error has arisen in the received word, an error locator polynomial P(x) and an error value polynomial Q(x) based on the syndromes and the equations, that is, $$P(x) = Ax^2 + Bx + C$$
$$Q(x) = A/B(S0_x + S1) + S0;$$

an error locator determining step for determining an error location by finding roots of the error locator polynomial P(x); and an error value determining step for determining error values by substituting the roots of the error locator polynomial P(x) into the error value polynomial Q(x).

3. An error correcting method comprising:

generating an address of each symbol of a received word on the basis of a primitive element of a Galois field;

storing said each symbol in said address;

generating syndromes from the received word;

generating operation expressions from the syndromes;

estimating a number of errors in the received word from the operation expressions;

calculating a position and value of an error when it is estimated that the error has arisen; and reading out said each stored symbol and correcting the error in the received word on the basis of the calculated error position and error value.

4. An error correcting apparatus comprising:

syndrome generating means for generating four syndromes S0, S1, S2 and S3 from a received word;

equation generating means for generating three equations A, B and C based on the syndromes, $$A = S0S2 + S1^2$$
$$B = S1S2 + S0S3$$
$$C = S1S3 + S2^2;$$

estimating means for estimating a number of errors in the received word, based on the syndromes and the equations such that it is estimated that no error has occurred in the received word when all of the syndromes are zero, that a single error has occurred in the received word when all of the equations are zero, and that a double error has occurred in the received word when B is not zero;

calculating means for calculating an error position and an error value when the single error or the double error has occurred; and correcting means for correcting the error based on the position and the value calculated by said calculating means.

5. An error correcting apparatus comprising:

address generating means for generating an address of each symbol of a received word from a primitive element of a Galois field;

a memory for storing said each symbol at the address generated by said address generating means;

syndrome generating means for generating syndromes from the received word;

operation expression generating means for generating operation expressions from the syndromes generated by said syndrome generating means;

error count estimate means for estimating a number of errors in the received word from the operation expressions generated by said operation expression generating means;

error position/error value calculating means which, when it is estimated by said error count estimate means that an error has arisen in the received word, calculates a position and value of the error; and error correcting means which, based on the error position and error value calculated by said error position/error value calculating means, reads out said each symbol stored in said memory at the address corresponding to the error position and corrects the error in the received word.

* * * * *